(12) United States Patent
Kang et al.

(10) Patent No.: US 7,061,177 B2
(45) Date of Patent: Jun. 13, 2006

(54) PLASMA DISPLAY DEVICE

(75) Inventors: Tae-Kyoung Kang, Asan (KR); Ki-Jung Kim, Gongju (KR); Myung-Gon Kim, Asan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 193 days.

(21) Appl. No.: 10/424,135

(22) Filed: Apr. 28, 2003

(65) Prior Publication Data

US 2004/0036396 A1    Feb. 26, 2004

(30) Foreign Application Priority Data

May 2, 2002    (KR) .................. 10-2002-0024111

(51) Int. Cl.
*H01J 17/49*    (2006.01)
*H05B 7/00*    (2006.01)
(52) U.S. Cl. ....................... 313/582; 361/816
(58) Field of Classification Search ............... 348/836, 348/797; 313/582–587; 361/816, 682, 800
See application file for complete search history.

(56) References Cited

U.S. PATENT DOCUMENTS 6,560,124 B1 * 5/2003 Irie et al. .................... 361/816
6,833,674 B1 * 12/2004 Kaneko et al. ............. 313/587

FOREIGN PATENT DOCUMENTS

JP    2002-006756    1/2002

* cited by examiner

*Primary Examiner*—Joseph Williams
(74) *Attorney, Agent, or Firm*—Robert E. Bushnell, Esq.

(57) ABSTRACT

A plasma display device assembled with a base of a chassis, a plasma display panel mounted on a front side of the chassis' base substantially in parallel to the chassis' base, and a drive circuit panel mounted on the reverse side of the chassis' base opposite from the plasma display panel is provided. A front cover is positioned around the exposed front side of the plasma display panel opposite from the chassis base, and a back cover is positioned on the rear side of the chassis base opposite from the plasma display panel while completely covering the chassis base. The back cover may be constructed with separate and discrete covering elements formed by a main cover having an opening that exposes circuitry for the drive circuit panel, and at least one sub-cover removably attached to the main cover to close an access opening in the main cover.

22 Claims, 7 Drawing Sheets

FIG. 6
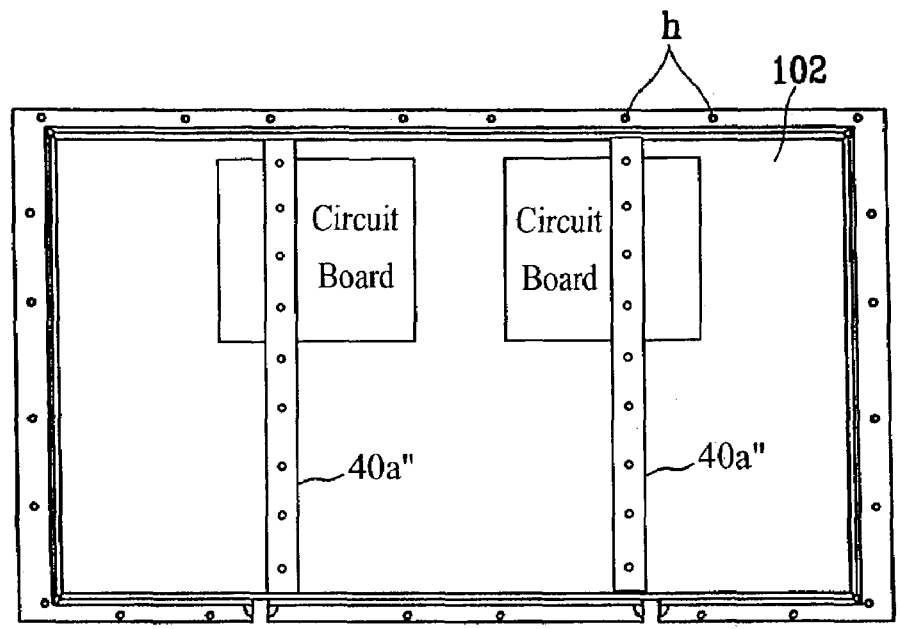
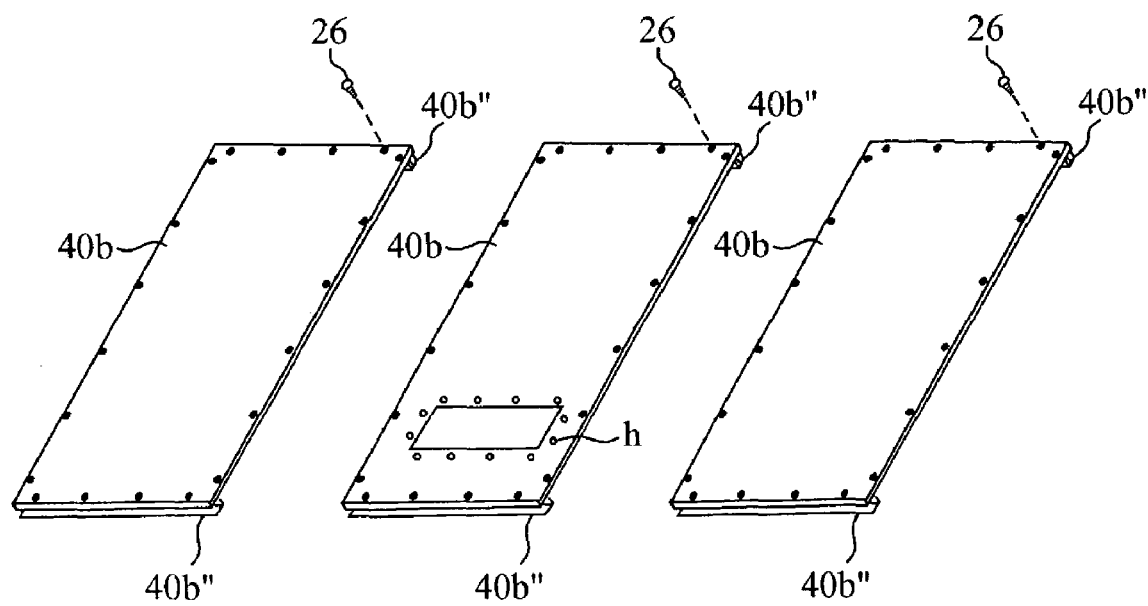

PLASMA DISPLAY DEVICE

CLAIM OF PRIORITY

This application makes reference to, incorporates the same herein, and claims all benefits accruing under 35 U.S.C §119 from an application entitled Plasma Display Device earlier filed in the Korean Industrial Property Office the 2$^{nd}$ day of May 2002, and there duly assigned Ser. No. 2002-0024111 by that Office.

BACKGROUND OF THE INVENTION

1. Field of the Invention

The present invention relates to a plasma display device, and, more particularly, to a plasma display device having a plasma display panel and housing therefor including a back cover constructed with a main cover having an opening to expose the electrical circuitry for operating the plasma display device, and a sub-cover attached to the opening in the main cover.

2. Description of the Related Art

A plasma display panel (PDP) typically provides a display in which ultraviolet rays generated by the discharge of gas excites phosphors to form predetermined variable visual images. There are indications that plasma display panels will become an important next generation flat panel display configuration because of the high resolution that is attainable with plasma display panels.

A plasma display device typically includes a PDP; a base of a chassis mounted substantially in parallel with the PDP; a thermally conductive medium interposed between and closely contacting the PDP and the chassis' base; and a panel of a drive circuit mounted on a side of the chassis base opposite from a panel mounting surface of the chassis' base, and connected to the PDP to drive the plasma display. A front cover is attached to a side of the PDP opposite from the thermally conductive medium, and a back cover is attached to a side of the drive circuit panel that is opposite from the chassis' base.

Plasma display devices with these structures are either placed on the floor as with typical televisions or are mounted on a wall. We have discovered that with contemporary designs for plasma display devices, if disassembly is required, particularly when access to the circuitry mounted on the drive circuit panel is desired, the entire back cover must be removed. A significant amount of time is required however, to remove all the screws for the back cover. It is also possible for the component parts as-well as the area of the plasma display panel covered by the back cover to become damaged during the removal and re-attachment of the back cover.

SUMMARY OF THE INVENTION

It is an object of the present invention to provide an improved plasma device.

It is another object to provide a plasma display device that allows for a significant reduction in the time required to remove and attach a back cover to the device.

It is another object to provide a plasma display device that facilitates access to its internal components.

It is still another object to provide an improved access panel in a chassis for a plasma display device.

It is yet another object to provide a plasma display device with a back panel removably mating with a front cover to encase a plasma display panel and one or more circuit boards bearing a circuit for drawing visual displays, with the back structurally cooperating with one or more access panels that complete the encasement while facilitating full, direct and unencumbered access to one or more components mounted on the circuit boards.

It is still yet another object to provide a plasma display device with a back cover removably mating with a front cover to encase a plasma display panel and one or more circuit boards bearing a circuit for drawing visual displays, with the back cover structurally cooperating with one or more access panels that complete the encasement while facilitating full, direct and unencumbered access to one or more components mounted on the circuit boards after removal of one or more of the access panels, without structural weakening of the encasement for the device created while the front cover is joined to the back cover.

In one embodiment, the present invention may be implemented with a plasma display device including a chassis base, a plasma display panel mounted on one side of the chassis base in a substantially parallel plane to that of the chassis base, and a drive circuit panel mounted on the side of the chassis base that is opposite from that to which the plasma display panel is mounted. A front cover is positioned on the side of the plasma display panel opposite the chassis base, and a back cover is positioned on the side of the chassis base that is opposite from the plasma display panel to completely cover the chassis' base. The back cover may be constructed with separate elements of a main cover having an opening that exposes circuitry of the drive circuit panel, and at least one sub-cover attached to the main cover to close the opening of the main cover.

It is preferable that the sub-cover include at least one protruding guide, and a corresponding number of protrusion insertion receptacles such as holes that are formed in the main cover into which the one or more protruding guides are inserted.

A connecting member maybe formed on a short section of the sub-cover. The connecting member may be attached to a short section of the opening of the main cover.

The sub-cover may be preferably implemented with two to four sectional cover members.

One, or in other embodiments, more reinforcing columns may be provided in the main cover and the sub-cover is attached to the reinforcing column. The reinforcing column may be disposed to prevent warping of the sub-cover.

In another embodiment, the present invention may be implemented with a plasma display device including a plasma display panel, a drive circuit panel may be attached to one side of the plasma display panel along a plane that is substantially parallel to the plasma display panel, and a front cover may be positioned on the side of the plasma display panel that is opposite from the drive circuit panel. A back cover may be positioned on the side of the drive circuit panel that is opposite from the plasma display panel in order to cover the plasma display panel. The back cover may be implemented with separate elements of a main cover providing an opening that exposes circuitry of the drive circuit panel, and at least one sub-cover may be attached to the main cover in order to close the opening in the main cover.

With such configurations of the plasma display device, access to the circuitry for the drive circuit panel may be attained by removing only the sub-cover from the back cover while leaving the main cover attached. This significantly reduces the time required to perform repairs.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 6 is a rear elevation view of an alternative embodiment of a back cover for a plasma display device embodying the principles of the present invention.

DESCRIPTION OF THE PREFERRED EMBODIMENTS

Figure 1:
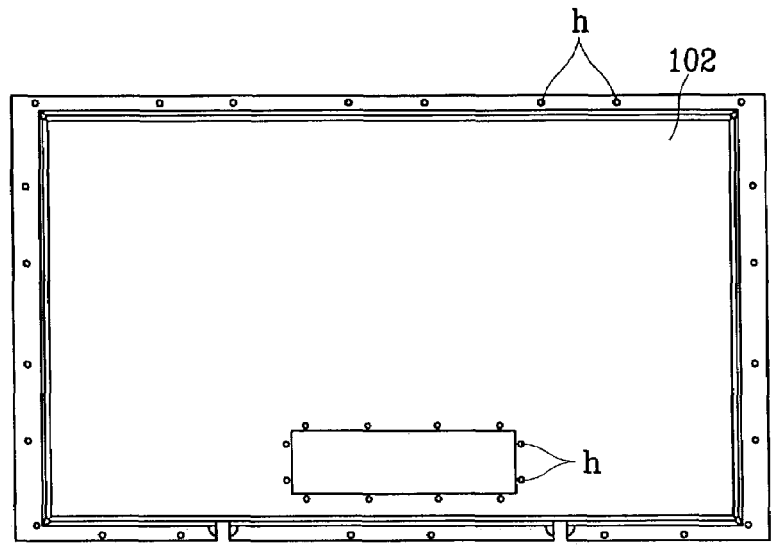
FIG. 1 is an elevation view illustrating a back cover for a exemplary plasma display device.

Turning now to the drawings and referring to FIG. 1, a plurality of screw holes "h" are formed in a back cover 102 to allow for the insertion of screws to attach the back cover 102 to a front cover (not shown) and a chassis base (not shown). The plasma display device with this structure may be placed on the floor as with typical home appliance televisions or, alternatively, may be mounted on a wall.

If disassembly is required, particularly when access to the circuitry mounted on the drive circuit panel for repair of the same is needed, back cover 102 must be removed. A significant amount of time is required however, to remove all the screws in screw holes "h" of back cover 102. Also, it is possible for the area of back cover 102 to which the screws are attached to become damaged during the removal and re-attachment of back cover 102.

Figure 2:
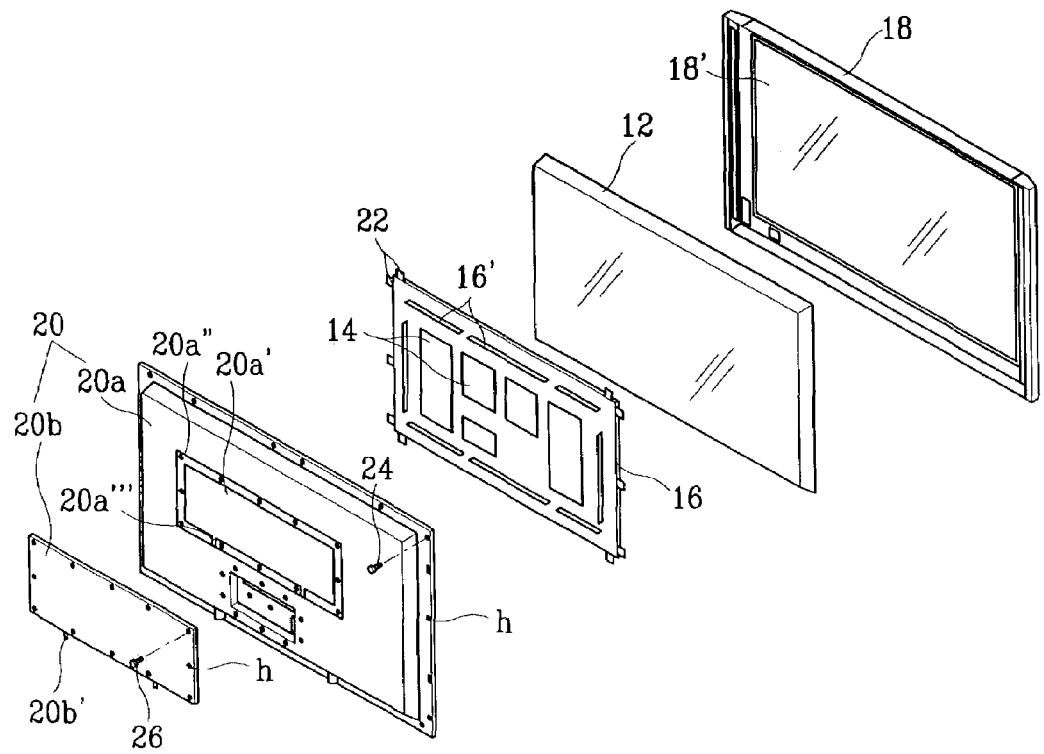
FIG. 2 is an exploded perspective view of a plasma display device constructed as a first embodiment according to the principles of the present invention.

Preferred embodiments of the present invention will now be described in detail with reference to the accompanying drawings. FIG. 2, an exploded perspective view illustrating a plasma display device constructed according to the principles of the present invention as an embodiment of the present invention, and FIG. 3, perspective view of the plasma display device in an assembled state.

Figure 3:
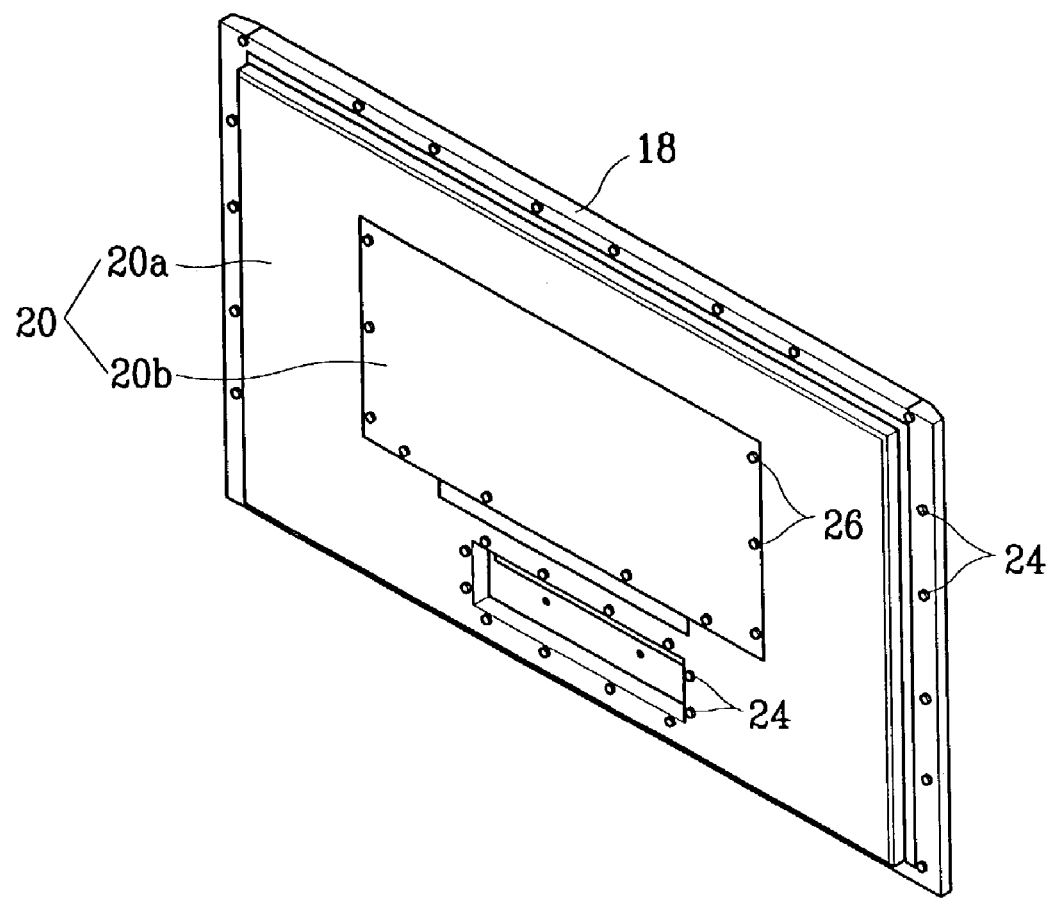
FIG. 3 is a perspective view of the plasma display device illustrated by FIG. 2 in an assembled state.

As illustrated by FIGS. 2 and 3, the plasma display device may be constructed to include a plasma display panel (PDP) 12 with a chassis base 16 positioned substantially parallel to one side of PDP 12. Drive circuit panels 14 are mounted on chassis base 16. Front cover 18 is positioned on the major of PDP 12 that is opposite from chassis base 16, and back cover 20 is positioned on the other major side of chassis base 16, opposite from PDP 12 to completely cover chassis base 16.

Chassis base 16 includes a plurality of bosses (not shown) on a side facing back cover 20. A plurality of reinforcement ribs 16', may be formed on chassis base 16. Furthermore, a plurality of laterally extending brackets 22 are provided around a periphery of chassis base 16. Brackets 22 allow the interconnection of front cover 18, chassis base 16, and back cover 20.

Conductive film filter 18' that is made of an electrically conductive material is mounted in the front cover 18 to block passage of static electricity to PDD 12. That is, front cover 18 forms a bezel that surrounds a periphery of conductive film filter 18'; static film filter 18 is mounted within an open space defined by the front cover 18.

As indicated by FIG. 3, back cover 20 is connected to front cover 18, with PDP 12 and chassis base 16 interposed therebetween, to thereby define an exterior housing of the plasma display device with the image formation surface, or screen, of PDP 12 exposed to the visual gaze of human viewers. The connection of back cover 20 and front cover 18 is realized through brackets 22 along the chassis' periphery of base 16. Main cover 20a is fastened to chassis' base 16 and front cover 18 with a plurality of fasteners such as screws 24.

In a plasma display device constructed according to the principles of the present invention, back cover 20 may be constructed with discrete and separate elements of main cover 20a and sub-cover 20b. Main cover 20a includes an opening 20a' that exposes the electronic circuitry of drive circuit panels 14 when back cover 20 is attached to the other elements of the device to encase base 16 for the chassis. Sub-cover 20b maybe screw-coupled to the main cover 20a such as with threaded fasteners or screws, in order to close opening 20a' of main cover 20a. Sub-cover 20b may be attached to main cover 20a using screws 26. Reference numeral 20a" in FIG. 2 refers to tabs of the main cover 20a to which the sub-cover 20b is attached, and "h" refers to screw holes into which screws 24, 26 are inserted. Also, protrusions 20b' are tabs that are formed on a lower portion (as shown in the drawing) of sub-cover 20b, and conforming receptacle holes (or slots) 20a'", into which tabs 20b' are inserted, are formed in main cover 20a.

With this structure, if it is necessary for a mechanic to gain access to the inside of the assembled device, particularly in order to repair the circuitry of the drive circuit panel 14 mounted on base 16, it is possible to remove only sub-cover 20b and leave main cover 20a fastened in place to front cover 18. Accordingly, the time required to access the inside of the housing for plasma display device is reduced considerably over the prior art devices.

Figure 4A:
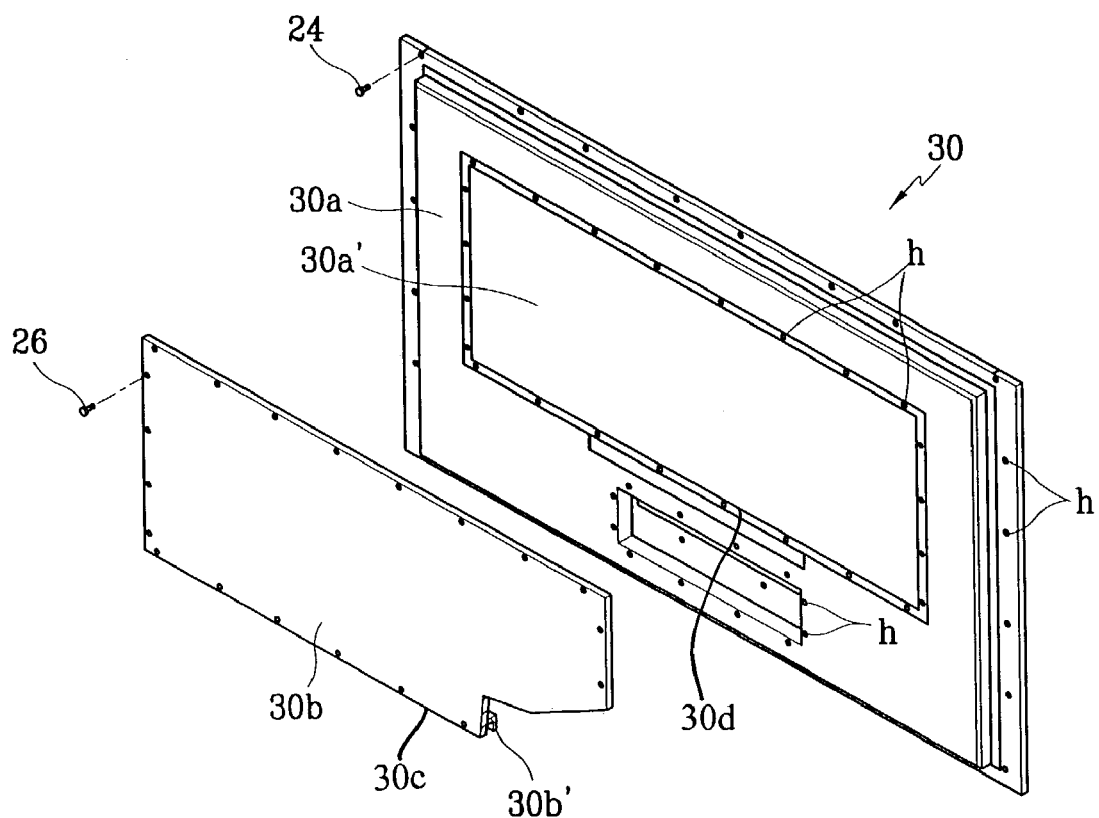
FIG. 4A is a perspective view of a back cover for a plasma display device constructed as a second embodiment of the present invention.
Figure 4B:
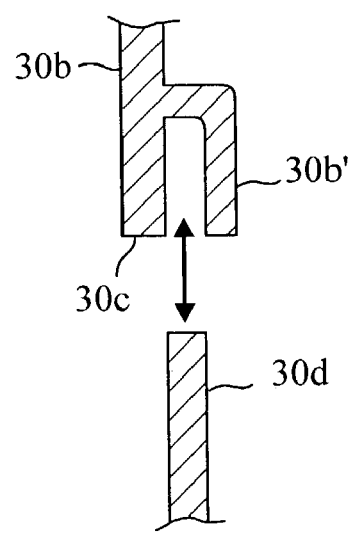
FIG. 4B is an enlarged cross-sectional view illustrating a detail for the plasma display device shown in FIG. 4A.

FIG. 4A is a perspective view of a back cover for a plasma display device constructed according to the principles of the present invention as another embodiment of the present invention. In this embodiment, an opening 30a' of main cover 30a of back cover 30 is increased in size over the previously described embodiment. Also, as illustrated by FIG. 4B sub-cover 30b includes connecting member such as an inner flange member 30b', formed along a short partial section or length, along the lower outer edge 30c of sub-cover 30b. Connecting member 30b' may be attached to a short sectional length of opening 30a' formed in the rear major planar surface of main cover 30a. Connecting member 30b' is a flange; together with the lower edge 30c of sub-cover 30b, flange 30b' forms a recess, or pocket between edge 30c and flange 30b' that is able to removably receive the lower, horizontal edge 30d of cover 30b. Once cover 30b is manually manipulated to place flange 30b' and edge 30c on opposite sides of lower edge 30d, cover 30b is oriented to enable one or more fasteners 26 to mate with holes "h" and there secure cover 30b to back cover 30. Other aspects of this embodiment are identical to those aspects of plasma display device described with reference to FIGS. 2 and 3. The main cover 30a in this embodiment acts as a frame.

Figure 5:
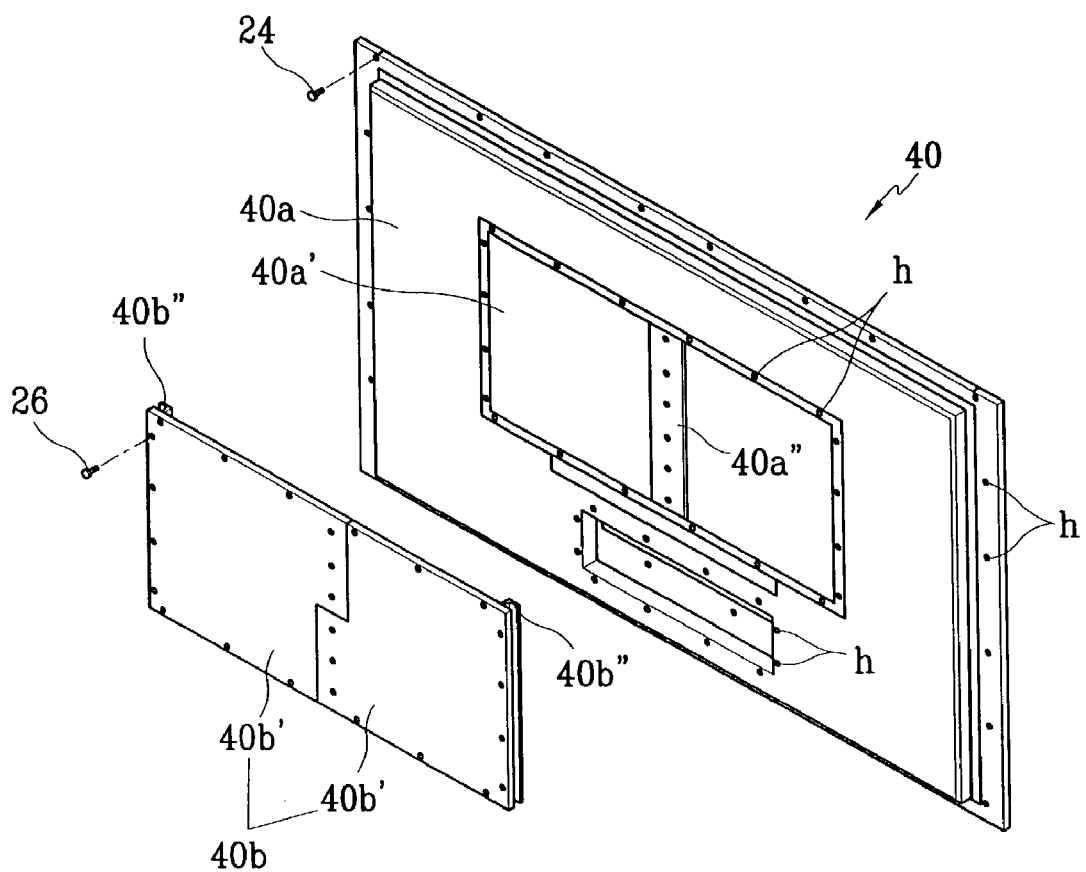
FIG. 5 is a perspective view of a back cover for a plasma display device embodiment of the present invention.

FIG. 5 is a perspective view of a back cover for a plasma display device constructed according to the principles of the present invention as yet another embodiment of the present invention. Back cover 40 for this embodiment of the present invention includes a main cover 40a and a sub-cover 40b, as in the embodiments described in the foregoing paragraphs. Sub-cover 40b for this preferred embodiment may be constructed with two separate cover members 40b'. It is also possible to form sub-cover 40b by using more than one cover member, or even with a larger number of cover members 40b' such as three or four cover members 40b'.

Figure 7:
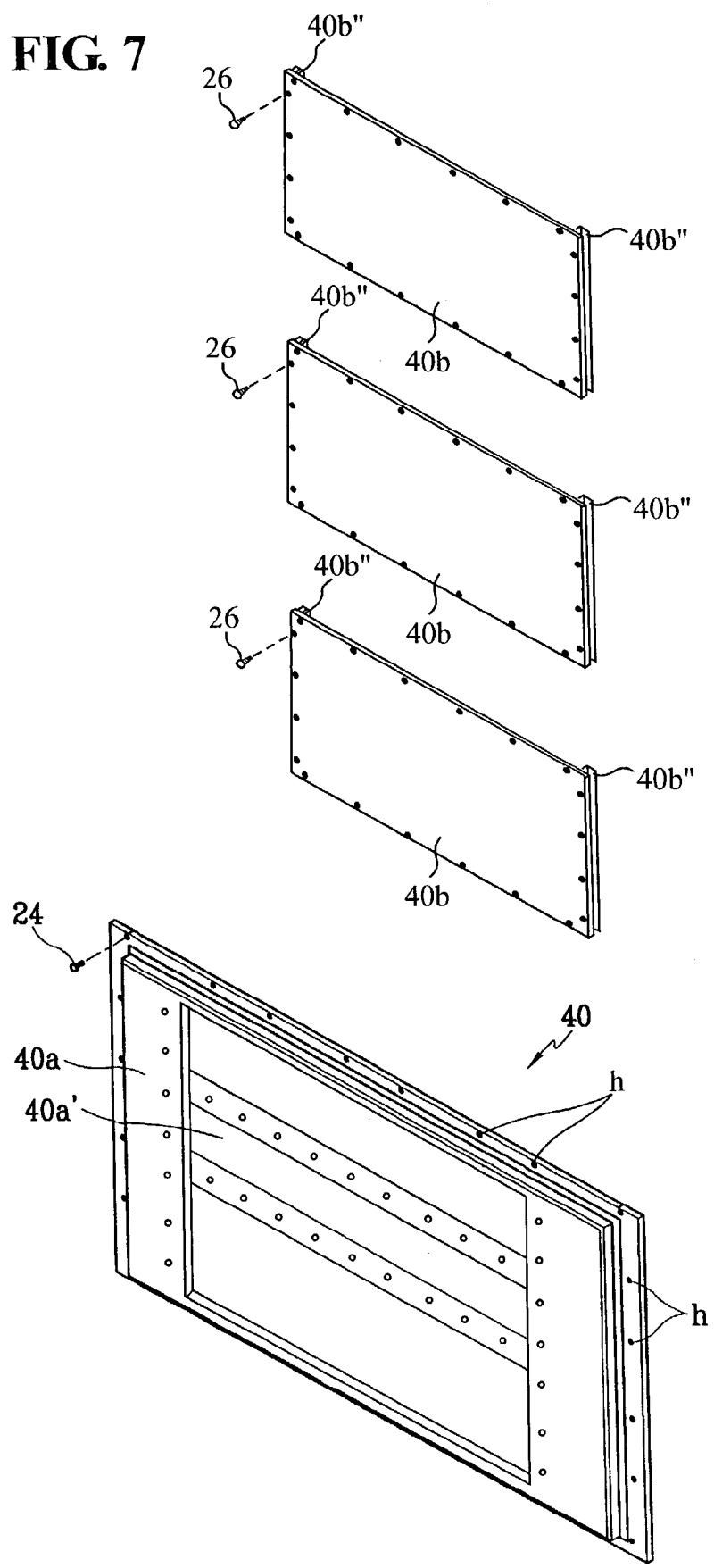
FIG. 7 is a rear elevation view of an alternative embodiment of a back cover for a plasma display device embodying the principles of the present invention.

A connecting element 40b" may be formed along one side of each of cover members 40b'. Also, a reinforcing column 40a" is formed across opening 40a' of main cover 40a. Sub-cover 40b maybe attached to reinforcing column 40a" in order to prevent warping of the sub-cover 40b which would concomitantly weaken the structural integrity of the encasement of panel 12 and chassis' base 16 provided when front cover 18 is joined together with rear cover 40. As shown in FIGS. 5 and 6, the plurality of cover members 40b', 40b and reinforcing column 40a" are configured such that the reinforcing column 40a" is mounted to extend vertically across opening 40a. It is also possible to configure these elements so that the reinforcing column 40a" is mounted to extend horizontally as illustrated by FIG. 7, or alternatively, diagonally across opening 40a' of the main cover 40a.

In these configurations, removal of one or more of cover member 40b provides direct and unencumbered access to one or more circuit boards 110 encased between the back cover 40 and the front cover 18, without requiring disassembly of the back cover 40 from the front cover 18. In alternative embodiments, a sub-cover maybe borne by one of the cover members 40b to provide direct access via opening 30b' to a switch or adjusting element mounted on the particular circuit board 14 located within opening 30b', and thereby alleviate the need to remove the corresponding cover member 40b'.

Figure 8:
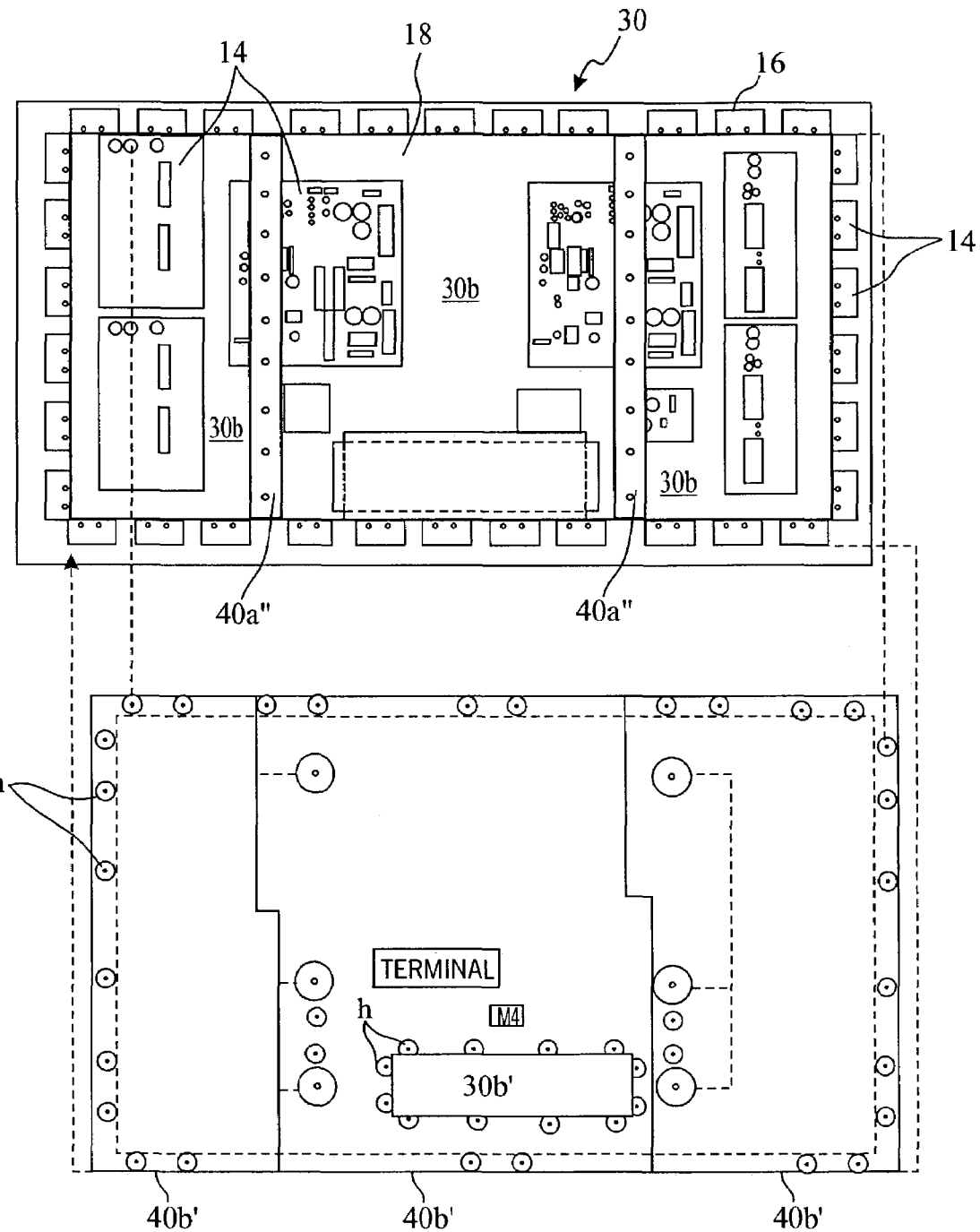
FIG. 8 is a partial assembly drawing illustrating the relation between the base of a chassis, a rear cover, reinforcing columns and the subcovers.

Turning now to FIG. 8, in a plasma display device constructed according to the principles of the present invention described in the foregoing description, the back cover is constructed with a main cover and a sub-cover that may be attached to the rear cover portion of the main cover. As a result, when access to the circuitry inside the device is required, as when a mechanic needs to perform repairs, it is possible to remove only the sub-cover while leaving the main cover attached, thereby preserving the structural integrity of the housing formed when front cover 18 is joined together with rear cover 40 and thereby minimizing the exposure of panel 12 and base 16 to accidental damage, while providing the mechanic with an unobstructed manual and direct visual to the several circuit boards 14 and other operational and functional features borne by base 16. This significantly reduces the time required to access the circuitry of the plasma display device in comparison with the time required to access the electronic circuitry of prior art devices. Furthermore, the sub-cover mounted on the back cover may be removed while the plasma display device is maintained in its upright position for normal, everyday use.

Although the above-described back cover is separated into a main cover and sub-covers, the present invention contemplates that a plasma display device may have a back cover that is constructed with separate elements forming a plurality of sub-covers that are assembled to each other.

The back cover of the present invention may also be applied to designs where a separate chassis' base is not provided as a discrete structural element of the plasma display device. That is, in such a configuration, the drive circuit panel is mounted to one side of the PDP and the front cover is positioned on the opposite side of the PDP. The back cover is mounted on the reverse side of the drive circuit panel, opposite from the PDP. Similarly to designs with a chassis that have a base that is included in the structure of the device, the back cover includes a main cover that has an opening to expose the circuitry of the drive circuit panel, and a sub-cover attached to the main cover to cover the opening of the main cover.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A plasma display device, comprising:
   a base of a chassis;
   a plasma display panel mounted on a front side of the base substantially in parallel with the base;
   a drive board bearing an electrical circuit mounted on a reverse side of the base;
   a bezel positioned to expose a front side of the plasma display panel opposite from the base to visual observation; and
   a back cover positioned on a reverse side of the base opposite from the plasma display panel, said back cover comprising:
      a main cover having an opening exposing electrical circuitry borne by the drive board; and
      at least one sub-cover removably attached to the main cover to close the opening in the main cover.

2. The plasma display device of claim 1, wherein the sub-cover includes at least one guide protruding from an edge of the sub-cover, and a corresponding number of slots formed along a periphery of the opening in the main cover receivably accommodating insertion of the guide.

3. The plasma display device of claim 1, wherein a connecting member is formed along an edge of the sub-cover, the connecting member engaging a section of the opening in the main cover.

4. The plasma display device of claim 1, wherein the sub-cover comprises a plurality of discretely removable covers.

5. The plasma display device of claim 1, with the back cover further comprising a reinforcing column in the main cover, and the sub-cover being removably attached to the reinforcing column.

6. The plasma display device of claim 4, with the back cover further comprising a reinforcing column extending across the opening in the main cover, and the sub-cover being removably attached to the reinforcing column.

7. A plasma display device, comprising:
   a chassis base;
   a plasma display panel mounted on a front side of the chassis base in substantially parallel with the chassis base to provide a video display;
   a drive board bearing an electrical circuit mounted on a reverse side of the chassis base opposite from the plasma display panel;

a front cover positioned to expose said visual images appearing on a front side of the plasma display panel opposite from the chassis base; and a back cover positioned on said reverse side of the chassis base opposite from the plasma display panel while covering the chassis base, said back cover comprising:
  a main cover including an opening for exposing said drive board; and
  a plurality of sub-covers removably attached to said main cover to close said opening in said main cover.

8. The plasma display device of claim 7, with said back cover further comprising a reinforcing column disposed across said opening in the main cover, and said sub-covers being removably attached to the reinforcing column.

9. The plasma display device of claim 7, further comprised of each said sub-cover being individually removable from said main cover to expose a different corresponding portion of said majority of drive boards.

10. The plasma display device of claim 7, further comprised of said main cover forming a rim around said opening, with said sub-covers being removably attached to said main cover along said rim.

11. The plasma display device of claim 7, further comprised of each of said sub-covers being aligned to simultaneously and removably both engage said main cover and cooperate with a neighboring one of said plurality of sub-covers to cooperatively enclose different portions of said drive board.

12. The plasma display device of claim 7, further comprised of a connecting member formed along an edge of the sub-cover, the connecting member engaging a section of the opening in the main cover.

13. A plasma display device, comprising:
  a plasma display panel;
  a drive circuit board bearing an electrical circuit disposed to drive said plasma display panel to display varying visual images on a front side, said drive circuit board being attached to a reverse side of the plasma display panel substantially in parallel to the plasma display panel;
  a bezel positioned on said front side of the plasma display panel opposite from the drive circuit board; and
  a back cover positioned on a reverse side of the drive circuit board opposite from the plasma display panel while covering the drive circuit board, the back cover comprising:
    a main cover having an opening that exposes said electrical circuit, and
    at least one sub-cover removably attached to the main cover to close the opening in the main cover.

14. The plasma display device of claim 13, wherein said sub-cover comprises at least one guide protruding from an edge of the corresponding sub-cover and the main cover bears at least one slot receivably accommodating insertion of corresponding the guide.

15. The plasma display device of claim 13, with said back cover further comprising a reinforcing column disposed across said opening of the main cover, and said sub-cover being removably attached to the reinforcing column.

16. The plasma display device of claim 13, further comprised of said sub-cover being individually removable from said main cover to expose a different corresponding portion of said majority.

17. The plasma display device of claim 13, further comprised of said main cover forming a rim around said opening, with said sub-cover being removably attached to said main cover along said rim.

18. The plasma display device of claim 13, further comprised of each of said sub-covers being aligned to simultaneously and removably both engage said main cover and cooperate with a neighboring one of said plurality of sub-covers to cooperatively enclose different portions of said drive circuit board.

19. The plasma display device of claim 13, further comprised of a connecting member formed along an edge of the sub-cover, the connecting member engaging a section of the opening in the main cover.

20. The plasma display device of claim 7, wherein said front cover covers a flank of the plasma display panel.

21. The plasma display device of claim 1, wherein the sub-cover is similar in size to the opening in the main cover.

22. The plasma display device of claim 1, wherein the sub-cover is similar in shape to the opening in the main cover.

* * * * *